(12) United States Patent
Ertz et al.

(10) Patent No.: US 12,072,363 B2
(45) Date of Patent: Aug. 27, 2024

(54) METHOD AND GENERATOR FOR CHARACTERIZING AN OSCILLATORY SYSTEM

(71) Applicant: Herrmann Ultraschalltechnik Gmbh & Co. KG, Karlsbad (DE)

(72) Inventors: Gabriel Ertz, Hannover (DE); Jens Twiefel, Hannover (DE); Jorg Wallaschek, Hannover (DE)

(73) Assignee: HERRMANN ULTRASCHALLTECHNIK GMBH & CO. KG, Karlsbad (DE)

( * ) Notice: Subject to any disclaimer, the term of this patent is extended or adjusted under 35 U.S.C. 154(b) by 201 days.

(21) Appl. No.: 17/626,615

(22) PCT Filed: Jul. 15, 2020

(86) PCT No.: PCT/EP2020/069972
§ 371 (c)(1),
(2) Date: Jan. 12, 2022

(87) PCT Pub. No.: WO2021/013649
PCT Pub. Date: Jan. 28, 2021

(65) Prior Publication Data
US 2022/0252649 A1    Aug. 11, 2022

(30) Foreign Application Priority Data

Jul. 23, 2019   (DE) ..................... 10 2019 119 911.5

(51) Int. Cl.
*G01R 29/22*   (2006.01)
*B06B 1/02*    (2006.01)
(Continued)

(52) U.S. Cl.
CPC ........ *G01R 27/2605* (2013.01); *B06B 1/0253* (2013.01); *B06B 1/06* (2013.01); *B06B 2201/72* (2013.01)

(58) Field of Classification Search
CPC ....... B06B 1/06; B06B 1/0253; B06B 1/0644; B06B 2201/72; G01R 31/2824; G01R 27/2605; G01R 29/22; H10N 30/802
(Continued)

(56) References Cited

U.S. PATENT DOCUMENTS 6,006,589 A  12/1999 Rodahl et al.
6,175,180 B1  1/2001 Angelini et al.
(Continued)

FOREIGN PATENT DOCUMENTS

CN  102788923 A  11/2012
CN  102959367 A  3/2013
(Continued)

OTHER PUBLICATIONS

Neubig, Bernd; Briese, Wolfgang: Das Grosse Quarzkochbuch, Feldkirchen; Franzis-Verlag, 1997—ISBN 3-7726-5853-5, URL: https://www.axtal.com/Deutsch/TechnInfo/Quarzkochbuch [abgerufen am Jul. 5, 2020].
(Continued)

*Primary Examiner* — Gabriel Agared
(74) *Attorney, Agent, or Firm* — PAUL & PAUL

(57) ABSTRACT

The present invention relates to a method for determining at least one physical characteristic value of an electromechanical oscillatory system, which comprises a piezoelectric element and at least one additional element coupled, with respect to oscillation, to the piezoelectric element, the piezoelectric element having an electrode and a counter electrode. The method comprises the following steps: (a) applying an electrical alternating voltage between the electrode and the
(Continued)

Figure 1:
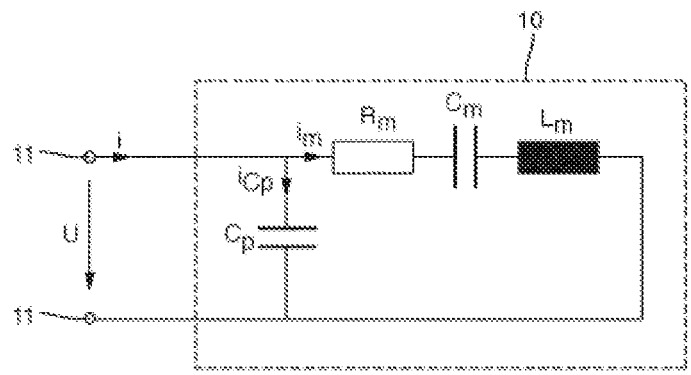

counter electrode for the duration of an excitation interval in order to induce mechanical oscillation of the oscillatory system or of a sub-system of the oscillatory system, so that after the excitation interval has expired, the oscillatory system or the sub-system performs a free oscillation without excitation, (b) after the end of the excitation and during the free oscillation of the oscillatory system or of the sub-system without excitation: (i) measuring a time curve of a voltage U between the electrode and the counter electrode, or (ii) short-circuiting the electrode and the counter electrode with a line and measuring a time curve of a current I through the line, and (c) determining the at least one physical characteristic value of the electromechanical oscillatory system from the time curve of the voltage U, which time curve was measured in step b) i), or the time curve of the current I, which time curve was measured in step b) ii).

9 Claims, 3 Drawing Sheets

(51) Int. Cl.
    *B06B 1/06* (2006.01)
    *G01R 27/26* (2006.01)
(58) Field of Classification Search
    USPC .......................................................... 318/114
    See application file for complete search history.

(56) References Cited

U.S. PATENT DOCUMENTS

| | | | | |
|---|---|---|---|---|
| 9,316,673 | B2* | 4/2016 | Ashton | ............... G01R 27/2605 |
| 9,423,291 | B2 | 8/2016 | Jurzitza | |
| 2003/0168938 | A1* | 9/2003 | Wallaschek | ............. H01L 24/75 |
| | | | | 310/328 |
| 2010/0164481 | A1 | 7/2010 | Teng et al. | |
| 2011/0025169 | A1* | 2/2011 | Haussecker | ............ H02N 2/003 |
| | | | | 310/323.16 |
| 2012/0293270 | A1 | 11/2012 | Zhang et al. | |
| 2013/0104647 | A1 | 5/2013 | Lopatin et al. | |
| 2013/0212848 | A1 | 8/2013 | Gabl | |
| 2014/0157899 | A1 | 6/2014 | Jurzitza | |
| 2016/0039613 | A1* | 2/2016 | Bott | ........................ B65G 27/32 |
| | | | | 198/751 |
| 2016/0039614 | A1* | 2/2016 | Bott | ......................... B06B 3/00 |
| | | | | 198/751 |
| 2017/0170786 | A1* | 6/2017 | Imanishi | ................. H03B 5/364 |
| 2018/0113159 | A1* | 4/2018 | Nastase | .............. G01R 27/2605 |
| 2018/0342666 | A1 | 11/2018 | Kanning et al. | |

FOREIGN PATENT DOCUMENTS

| | | | |
|---|---|---|---|
| CN | 103069597 A | | 4/2013 |
| CN | 103597327 A | | 2/2014 |
| DE | 69610183 T2 | | 6/2001 |
| DE | 10325446 B3 | | 3/2005 |
| DE | 69923618 T2 | | 4/2006 |
| DE | 102007031168 B3 | | 1/2009 |
| DE | 102011052283 A1 | | 1/2013 |
| DE | 102014012917 B3 | | 12/2015 |
| DE | 102018111380 A1 | | 11/2018 |
| FR | 2855879 A1 | | 12/2004 |
| GB | 637112 | | 5/1950 |
| TW | 201024750 A | | 7/2010 |

OTHER PUBLICATIONS

Office Action, dated Jun. 1, 2023, Chinese Patent Application No. 202080051747.3 (English Translation).
Stefan Sedlmaier, The International Bureau of the World Intellectual Property Organization, International Preliminary Report on Patentability, PCT/EP2020/069972, dated May 14, 2021 (English translation).

* cited by examiner

METHOD AND GENERATOR FOR CHARACTERIZING AN OSCILLATORY SYSTEM

CROSS-REFERENCE TO RELATED APPLICATIONS

This application is a national phase of International Application PCT/EP2020/069972 filed Jul. 15, 2020, and claims the priority of German Application No. 10 2019 119 911.5, filed on Jul. 23, 2019.

The present invention relates to a method for determining at least one physical characteristic value of an electromagnetic oscillatory system, which comprises a piezoelectric element and at least one additional element coupled, with respect to oscillation, to the piezoelectric element, the piezoelectric element having an electrode and a counter electrode. The present invention moreover relates to a method for operating an ultrasonic oscillatory system in which the aforementioned method for determining at least one physical characteristic value of the ultrasonic oscillatory system is used. In addition, the present invention also relates to a generator for supplying an alternating voltage and for carrying out the aforementioned methods.

Oscillatory systems with piezoelectric elements are used in numerous areas of industry and research. The uses of piezoelectric elements in speakers, piezo motors, and ultrasonic oscillatory systems, such as ultrasonic welding devices, are cited as examples. The advantages of the present invention result in all areas where piezoelectric elements are used as part of an oscillatory system and where control or regulation of the oscillation is desired. The features and advantages of the present invention are explained below predominantly with reference to an example of ultrasonic oscillatory systems, in particular with reference to industrial ultrasonic welding devices.

It is desirable that reproducible results of a particular quality can be produced with oscillatory systems, be it weld seams in the case of ultrasonic welding devices, cuts in the case of ultrasonic cutting devices, sounds in the case of speakers, or images of the body interior in the case of ultrasonic devices in medicine.

For example, if continuous processes are carried out with ultrasonic oscillatory systems, such as is the case when welding a material with the sonotrode of an ultrasonic welding device, the quality of the process and the reproducibility of the process result (of the weld seam) significantly depend on the temporal behaviour of the amplitude of the mechanical oscillation used. In the case of an ultrasonic welding process, it is particularly desirable that the amplitude of the oscillation varies as little as possible for the duration of the process or for the entire service life of the ultrasonic welding device so that the weld seams produced with the ultrasonic welding device are homogeneously formed and have a reproducible quality.

Decisive for the quality of the weld seam is also the absolute magnitude of the oscillation amplitude. Once the appropriate oscillation amplitude for an ultrasonic welding process is found, it is preferably used again and again for comparable processes.

The control of the oscillation amplitude or the temporal behaviour of the oscillation amplitude therefore significantly contributes to the control of the quality and reproducibility of a weld seam produced with an ultrasonic welding device or the corresponding product.

Generally, the following applies to mechanical oscillatory systems: The more precisely the amplitude of an oscillatory system can be set, regulated, and controlled, the better the corresponding process or product quality can be controlled and consequently also optimised.

In the case of a piezoelectric element used as an actuator as in an ultrasonic welding device, the oscillation amplitude of the relevant oscillatory system can be regulated via an alternating voltage applied to the actuator (piezoelectric actuator). The relationship between the alternating voltage U(t) used, which naturally varies over the time t, and the amplitude X of the oscillatory system results as follows: The oscillation amplitude X behaves proportionally to the charge Q of the piezoelectric actuator: X~Q. The charge Q results in turn from the integration over the measurable current I from which the electrical portion $I_{SW}$ of the current is subtracted, wherein the electrical portion of the current results from the product of the time derivative $\dot{U}$ of the applied voltage U and the electric capacitance $C_{SW}$ of the oscillatory system. Consequently, the following applies: $Q=\int I-\dot{U}\ C_{SW}$. The applied alternating voltage U is the only control variable that can be set from the outside in the case of this interdependence. The oscillation amplitude X can therefore in principle be set/regulated via a corresponding adjustment of the alternating voltage U.

In the known ultrasonic oscillatory systems or their uses, the capacitance $C_{SW}$ of the oscillatory system is assumed to be an invariable constant. The electric capacitance $C_{SW}$ is usually determined prior to the commissioning of an ultrasonic oscillatory system by an external measurement or on the basis of previously known capacitance values of the electric and piezoelectric elements of the ultrasonic oscillatory system, and the value thus determined once is used as the basis for future processes.

The electric capacitance $C_{SW}$ of an oscillatory system is generally the sum of the capacitances of the electric and piezoelectric elements of an oscillatory system. For example, the electric capacitance $C_{SW}$ in an ultrasonic oscillatory system is frequently composed of at least the capacitance of the piezoelectric element $C_P$ and the electric capacitance of the cable used $C_{cabel}$ that connects the piezoelectric element to an alternating voltage source.

However, the capacitance of an ultrasonic oscillatory system may change over time. For example, if an old cable connecting the piezoelectric element to an alternating voltage source is replaced by a new cable, this may have an impact on the capacitance of the ultrasonic oscillatory system since the capacitance of the new cable can frequently differ from the capacitance of the old cable. This is in particular very likely if the cable lengths of the old and the new cable differ.

In addition to changes in the electric capacitance $C_{SW}$ of the oscillatory system, which may result from such a change in system design (cable swap), the capacitance of the electric and piezoelectric elements of the oscillatory system, for example the capacitance of the piezoelectric element, also changes intrinsically. These changes may be permanent due to ageing, wear, or temporary due to external environmental factors, such as temperature fluctuations.

However, if an oscillation with a determined oscillation amplitude is now to be generated with a known ultrasonic oscillating device, the stored value for the electric capacitance $C_{SW}$ of the oscillatory system is used to determine the alternating voltage required for this purpose, without checking whether the stored value still corresponds to the actual value. It is therefore common for an ultrasonic oscillating device to be operated at a particular alternating voltage in order to achieve a particular oscillation amplitude, but this oscillation amplitude is never reached.

This also becomes clear by means of the mathematical relationship described above: If the electric capacitance $C_{SW}$ changes while the applied alternating voltage does not undergo any change, a change in the charge Q and thus a change in the oscillation amplitude X occurs due to the relationship between oscillation amplitude X, alternating voltage U(t), and capacitance $C_{SW}$ described above.

The problem can be briefly explained using the example of an ultrasonic welding device. Prior to commissioning, the electric capacitance $C_{SW}$ is determined once by external measurements. Following commissioning, the assumption for all future processes is that the initially determined capacitance $C_{SW}$ of the relevant ultrasonic oscillatory system is present. Consequently, the alternating voltage applied to the piezoelectric element is set such that a desired oscillation amplitude that is to be expected when assuming the value for the capacitance $C_{SW}$ determined at the outset is reached. However, if the electric capacitance of the electric and/or piezoelectric elements of the ultrasonic oscillatory system now changes over the course of use of the ultrasonic welding device, the oscillation amplitude also changes. The changed oscillation amplitude is generally less suitable for the relevant process than the initially set oscillation amplitude. A reduction in the process quality, i.e., a reduction in the quality of the weld seams produced, therefore generally occurs.

A method for detecting a fault in a piezoelectric actuator is known from DE 103 25 446 B3.

In light of the above, it is the object of the present invention to provide a method and a generator for carrying out the method, with which elimination or at least reduction of the aforementioned disadvantages is realised or at least enabled.

This object is achieved by a method according to claim 1. This method is a method for determining at least one physical characteristic value of an electromagnetic oscillatory system, which comprises a piezoelectric element and at least one additional element coupled, with respect to oscillation, to the piezoelectric element, the piezoelectric element having an electrode and a counter electrode, comprising the following steps: (a) applying an electrical alternating voltage between the electrode and the counter electrode for the duration of an excitation interval in order to induce mechanical oscillation of the oscillatory system or of a sub-system so that after the excitation interval has expired, the oscillatory system or the sub-system performs free oscillation without excitation; (b) after the end of excitation and during the free oscillation of the oscillatory system or of the sub-system without excitation: (i) measuring a time curve of a voltage U between the electrode and the counter electrode, or (ii) short-circuiting the electrode and the counter electrode with a line and measuring a time curve of a current I through the line; and (c) determining the at least one physical characteristic value from the time curve of the voltage U, which time curve was measured in step (b) (i) or the time curve of the current I, which time curve was measured in step (b) (ii).

The term "physical characteristic value of the oscillatory system" in particular refers to the capacitance of the oscillatory system, the capacitance of a piezoelectric element, the resonance frequency of the oscillatory system, the anti-resonance frequency of the oscillatory system, the modal equivalent capacitance of the oscillatory system, the modal inductance of the oscillatory system, the resonant damping coefficient of the oscillatory system, the anti-resonant damping coefficient of the oscillatory system, the modal equivalent resistance of the oscillatory system, and additional parameters characterizing the oscillation, such as the resonance oscillation quality and the anti-resonance oscillation quality.

Within the meaning of the present invention, an oscillatory system may be excited as a whole or in part to mechanical oscillation. In the latter case, the elements that are excited to mechanical oscillation form a sub-system of the oscillatory system. For example, in the case of an ultrasonic oscillatory system, the converter and the sonotrode may be connected to a generator via an oscillation-damping cable so that the generator is not set in mechanical oscillation. In this case, the converter, the sonotrode, and, where applicable, parts of the cable form a sub-system of the oscillation system, which as a whole also comprises the entire cable and the generator.

The excitation interval is preferably less than 100 milliseconds, and particularly preferably less than 50 milliseconds.

By the method according to the invention, physical characteristic values, such as the capacitance $C_{SW}$ of the oscillatory system, which characterise the oscillation, can be determined without the need for disassembly of the oscillatory system and measurement of the individual elements of the oscillatory system. The method also allows the oscillatory system to be optimised as a function of the determined characteristic values.

In a preferred embodiment, the method according to the invention is a method for determining an electric capacitance $C_{SW}$ of the oscillatory system, wherein, according to alternative (i), the time curve of a voltage U between the electrode and the counter electrode of the piezoelectric element is measured in step (b), and the electric capacitance $C_{SW}$ is determined in step (c) from the time curve of the voltage U, which time curve was measured in step (b).

This method makes it possible to determine the electric capacitance $C_{SW}$ of an existing oscillatory system significantly faster than would have been possible without the present invention. The method according to the embodiment discussed here requires only approximately 150 ms to 200 ms to be performed completely, wherein the oscillatory system need not be disassembled or structurally modified. The capacitance of a piezoelectric element can thus be determined and also monitored extremely quickly and efficiently. Changes in electric capacitance $C_{SW}$ due to ageing, wear, or temperature fluctuations can be detected immediately, and an adequate response thereto can take place within a very short time.

According to a particularly preferred embodiment, an electric capacitance $C_{SW}$ of the oscillatory system is determined as follows: In step (b), a measuring device having an internal capacitance $C_{probe}$ and an internal resistance $R_{probe}$ is used to measure the time curve of the voltage, and step (c) comprises the following sub-steps: (aa) determining a time curve of a DC voltage portion $U_{DC}$ from the time curve of the voltage U, which time curve was measured in step (b); (bb) determining a characteristic time interval $\tau$ within which an initial value of the DC voltage portion $U_{DC,0}$ measured in step b) drops to the value $U_{DC,0}/e$; (cc) calculating the capacitance $C_p$ with the characteristic time interval $\tau$, preferably by means of the formula $C_{SW}=\tau/R_{probe}-C_{probe}$.

The letter "e" in this context is Euler's number e= 2.178 . . . . Moreover, in the preferred embodiment of step (cc), it is assumed that the capacitance of the measuring device $C_{probe}$ is not part of the electric capacitance of the oscillatory system. This is in particular justified if the measuring device is not permanently integrated in the oscillatory system. If the measuring device is alternatively integrated in the oscillatory system, in particular also during operation of the oscillatory system, the capacitance of the oscillatory system generally also comprises the capacitance of the measuring device $C_{probe}$ so that the following alternative formula would result: $C_{SW}=\tau/R_{probe}$.

The voltage time curve measured in step (b) is divided into a DC voltage portion $U_{DC}$ and an alternating voltage portion $U_{AC}$. The two portions are superimposed.

Particularly preferably, a high-pass filter is used to separate the DC voltage portion $U_{DC}$ so that the time constant $\tau$ can be precisely determined.

Sub-steps (aa), (bb), and (cc) may advantageously all be performed automatically by means of appropriately configured algorithms so that the capacitance $C_{SW}$ can be calculated by measuring the voltage U during a free oscillation of the oscillatory system without excitation. The characteristic time interval $\tau$ is also described as half-life of the voltage signal. In this embodiment, the method according to the invention makes use of the knowledge that the piezoelectric element and the additional electric elements of the oscillatory system physically act similarly to a plate capacitor that experiences an initial charging and subsequently discharges itself again. Just as the capacitance of a plate capacitor can be determined from its discharge curve, the capacitance of the oscillatory system, i.e., of the piezoelectric and electric elements of the oscillatory system, can accordingly be determined from the time curve or drop of the voltage U, which time curve or drop was measured in step (b) (i). Only the DC voltage portion $U_{DC}$ of the voltage U is relevant in this case.

To the extent that the capacitances of the purely electric elements of the oscillatory system are known, the capacitance $C_p$ of a used piezoelectric element can be determined from the electric capacitance $C_{SW}$. If no capacitances of the oscillatory system are connected in series, $C_p$ results from the subtraction of the capacitances of the other electric or piezoelectric elements of $C_{SW}$.

In a further embodiment, a frequency I close to or equal to a previously known resonance frequency of the oscillatory system is induced in step (a). This has the advantage that at the voltages or currents measured in step (b), the signal-to-noise ratio is particularly high so that the physical characteristic values to be determined can be determined with higher accuracy.

According to a preferred embodiment, in any of the methods described above in which at least the electric capacitance $C_{SW}$ of the oscillatory system is determined, the following further steps are to be provided: (d) short-circuiting the electrode and the counter electrode with a line and measuring a time curve of a current I through the line, wherein step (b) occurs during a first measurement interval and step (d) occurs during a second measurement interval, wherein the second measurement interval preferably occurs after the first measurement interval; (e) determining at least one further physical characteristic value, preferably an electrical equivalent parameter of the oscillatory system, from the time curve of the current I, which time curve was measured in step (d).

In this embodiment, both the curve of the voltage U and the curve of the current I are measured, i.e., alternative (i) is performed in step (b) and alternative (ii) is performed in step (d). Preferably, the voltage U is initially measured during a first measurement interval, then the electrode is short-circuited to the counter electrode, and the current I is measured during a second measurement interval.

The advantage of measuring the curves of voltage U and current I is that it is possible to determine a complete set of parameters that extensively characterises the oscillation of the oscillation system. Thus, as complete a picture as possible of the actual state of an oscillatory system with a piezoelectric element can be produced. This allows detailed process monitoring and efficient process regulation of corresponding oscillatory systems.

According to further embodiments, one or more of the following steps are provided alone or in combination with one another:

(f) determining a resonance frequency $f_{res}$ of the oscillatory system from the time curve of the current I, which time curve was determined in step (d);

(g) determining an anti-resonance frequency $f_{antires}$ of the oscillatory system from the time curve of the voltage U, which time curve was determined in step (b);

(h) step (f), step (g), and calculating the modal equivalent capacitance $C_m$ of the oscillatory system from the capacitance $C_p$ by means of the formula $$C_m = C_p\left(\frac{f_{antires}^2}{f_{res}^2} - 1\right);$$

(i) step (h) and calculating the modal equivalent inductance $L_m$ of the oscillatory system from the modal equivalent capacitance $C_m$, preferably by means of the formula $$L_m = \frac{1}{4\pi^2 f_{res}^2 C_m};$$

(j) determining a resonant damping coefficient $D_{res}$, which characterises a decrease of an envelope of the time curve of the current, which decrease is a function of the time t;

(j) determining an anti-resonant damping coefficient $D_{antires}$, which characterises a decrease of an envelope of the time curve of the voltage, which decrease is a function of the time t;

(l) step (f), step (i), step (j), and calculating the modal equivalent resistance $R_m$ by means of the formula $R_m=4\pi D_{res}L_m f_{res}$.

The measured time curve of the current behaves correspondingly to the mechanical oscillation of the oscillatory system. The resonance frequency or the anti-resonance frequency can therefore take place in steps (f) or (g) by measuring a period duration of the oscillation of the current I or of the voltage U or by Fourier analysis of the time curve of the current or the voltage.

The present invention also relates to a method for operating an ultrasonic oscillatory system. In this case, the core of the method is also the method according to the invention described above for determining a physical characteristic value of an oscillatory system. This method for determining a physical characteristic value is used in a method for operating an ultrasonic oscillatory system, the ultrasonic oscillatory system having at least a generator, a converter, and a sonotrode, wherein in order to perform ultrasonic machining, the sonotrode is brought into contact with a material to be machined, wherein the converter comprises at least one piezoelectric element, and wherein the generator supplies an alternating voltage, which is converted by the piezoelectric element of the converter into mechanical oscillation. According to the invention, during a machining break, i.e., when the sonotrode is not in contact with the material to be machined, a method for determining at least one physical characteristic value according to any of the embodiments described above with respect to this method is performed.

Machining breaks that occur in the process operation for various reasons can thus be used in a particularly advantageous manner to determine physical characteristic values that make a statement about the process quality of the ultrasonic oscillatory system, for example. This allows a very efficient integration of the method according to the invention for determining at least one physical characteristic value of an oscillatory system in the process of ultrasonic oscillatory systems.

In a preferred embodiment, the following steps take place during the machining break: (A) determining the electric capacitance $C_{SW}$ of the ultrasonic oscillatory system with a method for determining an electric capacitance $C_{SW}$ of the ultrasonic oscillatory system according to any of the embodiments described above, (B) setting the alternating voltage as a function of the electric capacitance $C_{SW}$ of the ultrasonic oscillatory system, which electric capacitance was determined in step (A).

This allows the oscillating process to be optimised as a function of the determined electric capacitance $C_{SW}$. With step (B), the method consequently goes beyond mere monitoring of oscillatory systems. The response to determining the electric capacitance $C_{SW}$, which response is to be performed in step (B), may in particular be retrieved automatically. The method can, for example, use predefined setting operations that take place in step (B) as a function of the determined electric capacitance $C_{SW}$. If, for example, the electric capacitance $C_{SW}$ is below or above a predefined lower or upper limit, the applied alternating voltage can, for example, be switched off in order to reduce the risk of damage to the ultrasonic oscillatory system.

In light of the fact that the capacitances of the electric and piezoelectric elements of an ultrasonic oscillatory system change as a function of time and temperature (ambient parameters), the embodiment discussed here provides temperature-adaptive and ageing-adaptive regulation of the oscillation amplitude.

In particular, a complete characterization of the oscillatory system, i.e., a determination of the electric capacitance $C_{SW}$, the resonance frequency $f_{res}$, the anti-resonance frequency $f_{antires}$, the modal equivalent capacitance $C_m$, the modal equivalent inductance $L_m$, the resonant damping coefficient $D_{res}$, the anti-resonant damping coefficient $D_{antires}$, and the modal equivalent resistance $R_m$ of the oscillatory system, can take place within a single machining break. This complete characterization takes place within a time interval of less than 300 ms, preferably less than 250 ms, and more preferably less than 200 ms.

In a particularly preferred embodiment, step (B) comprises the following sub-steps: (AA) determining the amplitude X of the mechanical oscillation of the ultrasonic oscillatory system with the electric capacitance $C_{SW}$ of the ultrasonic oscillatory system, which electric capacitance was determined in step (A); (BB) comparing the amplitude X with a setpoint amplitude $X_0$; (CC) setting the frequency and/or the amplitude of the alternating voltage supplied by the generator so that an amplitude X is equal to the setpoint amplitude $X_0$.

This embodiment of the method according to the invention realises that the mechanical oscillation amplitude of an ultrasonic oscillatory system is kept as constant as possible over time in order to produce reproducible results with the oscillatory system. This is achieved with the embodiment discussed here in an advantageous manner since it is checked whether the mechanical oscillation has the desired amplitude and, once a deviation is found, this deviation is compensated by a corresponding adjustment of the applied alternating voltage so that the setpoint value of the mechanical oscillation amplitude is again reached.

Machining breaks preferably occur repeatedly at regular intervals, during which machining breaks steps (A) and (B), including sub-steps (AA), (BB), and (CC), take place.

The object underlying the invention is moreover achieved by a device, namely a generator, for providing an alternating voltage and performing a method according to any of the embodiments discussed above, wherein the generator comprises an alternating voltage source, a potential line between the alternating voltage source and a potential connection, and a ground line between the alternating voltage source and a ground connection, wherein the ground line is connected to a ground. According to the invention, a short-circuit line connects the potential line to the ground line, wherein the generator comprises a first switching device with which the potential line can be interrupted and a second switching device with which the short-circuit line can be interrupted.

The generator according to the invention is specifically configured for performing the methods discussed above. In order to perform the excitation of the oscillation according to step (a), the first switching device is closed and the second switching device is opened so that the potential line is not interrupted and the short-circuit line is interrupted so that an alternating voltage is output at the potential connection. In order to perform step (b) (i), the first and second switching devices are open so that alternating voltage is no longer output at the potential connection and no short-circuit current can flow. In order to perform step (d) or alternative (b) (ii), the first switching device is opened and the second switching device is closed so that a short-circuit current can flow through the short-circuit line.

The generator according to the invention can be used universally since it can be used for different oscillatory systems without difficulty in order to regulate the oscillation amplitude. In combination with one of the methods according to the invention, the generator calibrates itself so that in each oscillatory system, it provides precisely the alternating voltage that is required for the oscillation amplitude desired therein without the user having to manually store process-specific parameters.

In addition to the generator according to the invention, only means for measuring the voltage and the current I are needed to perform the methods according to the invention. These means may be provided, for example, by an oscilloscope. Particularly preferably, the generator and the means for measuring the voltage and current are designed integrally as a generator with an integrated oscilloscope.

The method according to claims 1 to 7 can only be carried out by using a generator, i.e., without the use of external measuring devices.

Preferably, the first and second switching devices are designed as reed relays or semiconductor relays. Such relays advantageously ensure proper and fast switching, in particular fast disconnection of the potential line for performing steps (a) and (b), step (a) and proper short-circuiting in step (d) or alternative (b) (ii) while the oscillatory system performs a free oscillation.

The methods according to the invention and the generator according to the invention are preferably used for ultrasonic welding systems, particularly preferably for ultrasonic welding systems for welding plastics or non-wovens.

Further advantages, features, and possible applications of the present invention become apparent from the following description of a preferred embodiment of a method and a preferred embodiment of a generator and the associated figures.

Figure 2:
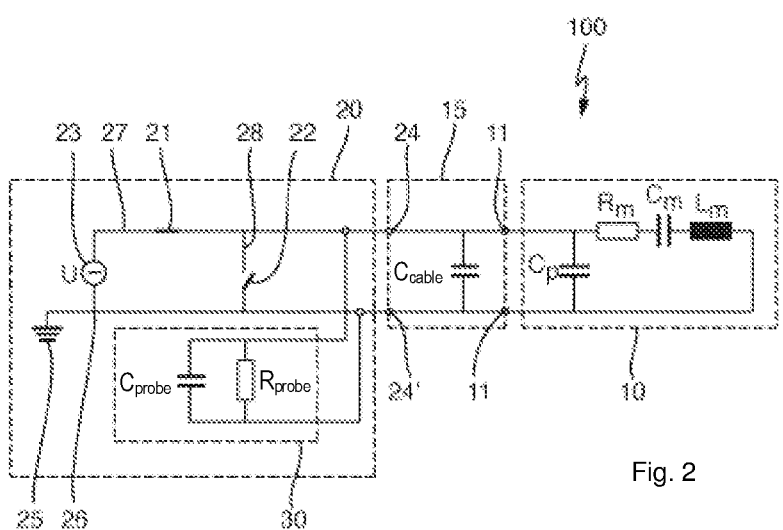
Figure 3:
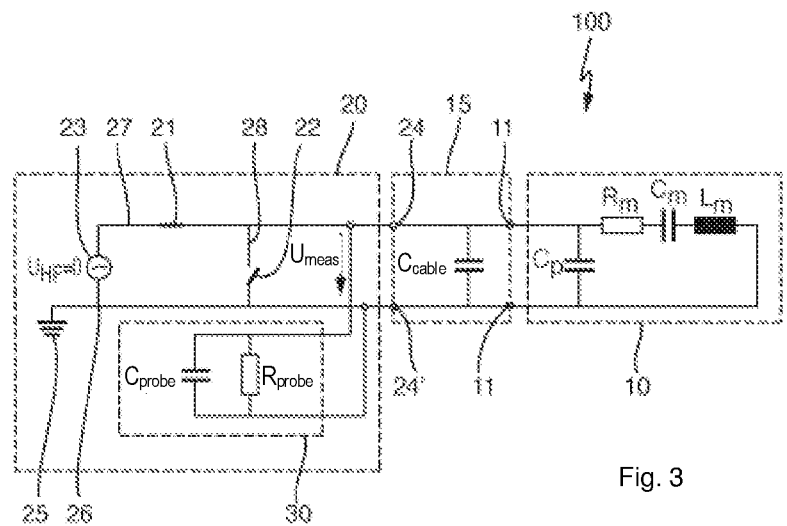
Figure 4:
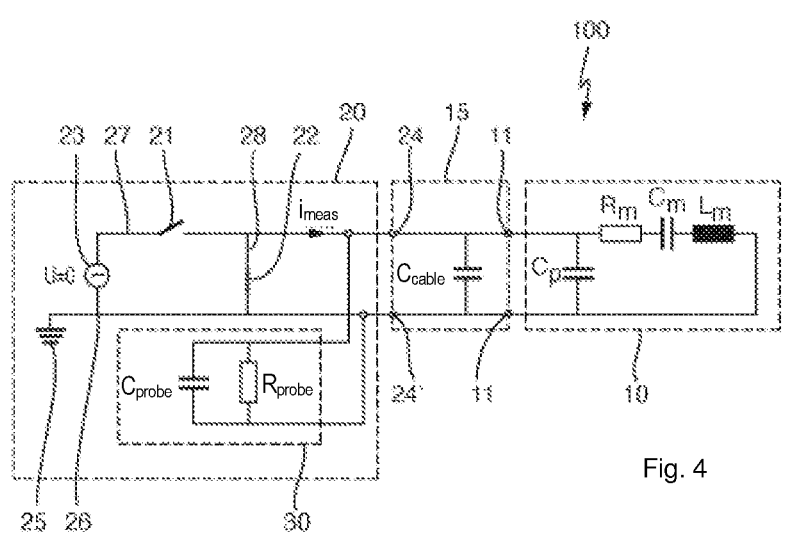
Figure 5:
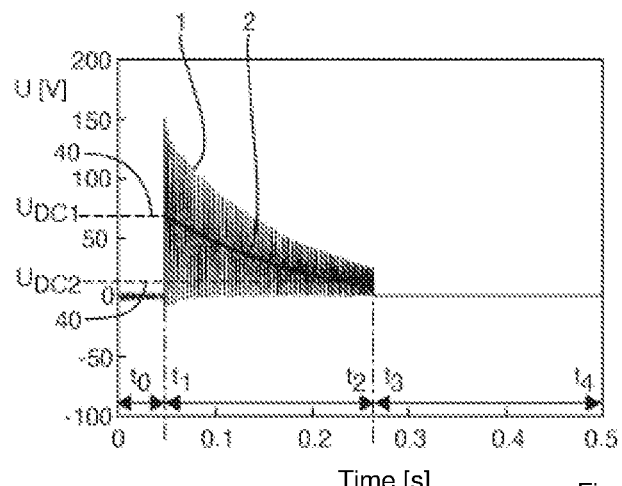
Figure 6:
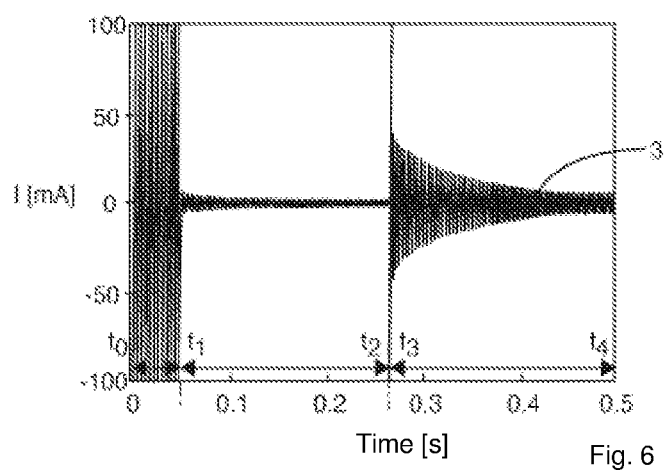

FIG. 1 shows a simplified equivalent circuit diagram of a first ultrasonic oscillatory system, FIG. 2 shows a circuit diagram of a second ultrasonic oscillatory system with a generator according to the invention in a first state, FIG. 3 shows a circuit diagram of the ultrasonic oscillatory system of FIG. 2 in a second state, FIG. 4 shows a circuit diagram of the ultrasonic oscillatory system of FIG. 2 in a third state, FIG. 5 shows a curve of the measured course of the voltage of the second ultrasonic oscillatory system after excitation close to the resonance frequency, FIG. 6 shows a curve of the measured course of the current of the second ultrasonic oscillatory system after excitation close to the resonance frequency.

The equivalent circuit diagram shown in FIG. 1 shows a case in which a piezoelectric element, namely a piezoelectric actuator 10, with the capacitance $C_p$ close to or equal to its resonance frequency, i.e., in an eigenmode, is excited with an alternating voltage U to an oscillation. The equivalent circuit diagram consequently shows an oscillatory system that does not have any electric or piezoelectric element other than the piezoelectric actuator.

The term "equivalent circuit diagram" should be understood to mean that the behaviour of the pure electric circuit which is shown in the equivalent circuit diagram and which represents an electric oscillatory circuit, can describe the behaviour of the underlying piezoelectric ultrasonic oscillatory system, which in reality also comprises mechanical elements in addition to electric elements.

Via a signal input 11, a voltage U is applied to the piezoelectric actuator 10 in the equivalent circuit diagram of FIG. 1. The circuit of the piezoelectric actuator 10 comprises a capacitor connected in parallel with the capacitance $C_p$, the capacitor representing the electrical domain of the equivalent circuit diagram. The electrical domain is the area of the equivalent circuit diagram that represents the electrical properties of a piezoelectric element. In this sense, the piezoelectric element actually has the electrical properties of a capacitor. The current $i_{Cm}$ flowing in the electrical domain is consequently an electric current flowing in reality in a piezoelectric element.

In contrast, the equivalent circuit diagram also has a mechanical domain comprising an equivalent resistance $R_M$, a capacitor with the equivalent capacitance $C_M$, and a coil with the equivalent inductance $L_M$, these three elements being connected in series. The mechanical domain of the equivalent circuit diagram describes the mechanical properties of a piezoelectric element. The elements of the mechanical domain do not represent actual electrical components but equivalent elements. These equivalent elements are designed to form an electric oscillatory circuit in which the charge amplitude behaves the same as the actual mechanical amplitude of the piezoelectric element. In this sense, the portion of current flowing in the mechanical domain and thus called "mechanical" current is also not current actually flowing in the piezoelectric element. It thus represents the conversion of electrical energy into mechanical energy within a piezoelectric element.

The electrical portion of the current I is denoted in FIG. 1 by $i_{Cp}$ and the mechanical portion of the current I is denoted in FIG. 1 by $i_{Cm}$. The entire current I also shown is measured. The amplitude of the mechanical oscillation results from the mechanical portion $i_m$ so that the electrical portion $i_{Cp}$ must be known in order to be able to determine $i_m$, thus the charge Q, and thus the amplitude X from a measurement of the entire current I. Since the electrical portion $i_{Cp}$ is a function of the capacitance of the oscillatory system, which is identical to the capacitance of the piezoelectric element in FIG. 1 (in FIG. 1: $C_p=C_{SW}$), the method according to the invention can be used in this case to determine this capacitance $C_p$ and thus improve the determinability and regulation of the oscillation amplitude.

FIGS. 2 to 6 show the measurements, data, and steps an embodiment of the method according to the invention uses to achieve this goal.

FIGS. 2, 3, and 4 respectively show a circuit diagram of an ultrasonic oscillatory system 100 having a generator, wherein FIGS. 2, 3, and 4 respectively show different states of the circuit within the generator 20. The ultrasonic oscillatory system 100 shown here also comprises a piezoelectric actuator 10, which is represented as an equivalent circuit diagram according to FIG. 1. The piezoelectric actuator is coupled, with respect to oscillation, to another element of the oscillatory system 100 (not shown here), for example a sonotrode, which is not shown here. The piezoelectric actuator 10 is connected to the generator 20 according to the invention via a cable 15, wherein the cable has a capacitance $C_{cable}$. The generator 20 consists of an alternating voltage source 23, which supplies an alternating voltage U. The voltage source 23 is connected via a ground line 26 to the ground connection 24' and via a potential line 27 to the potential connection 24 of the generator. The potential line comprises a first switching device 21, with which the potential line can be interrupted, i.e., the electrically conductive function of the potential line can be switched off. Moreover, a short-circuit line 28 is provided, which connects the potential line 27 and the ground line 26, wherein this line also comprises a switching device 22, with which the short-circuit line 28 can be interrupted, i.e., the electrically conductive function of the short-circuit line can be switched off.

The signal input 11 is connected to the electrode and the counter electrode of the piezoelectric actuator 10 in such a way that an alternating voltage applied to signal input 11 is applied between the electrode and the counter electrode of the piezoelectric actuator. Since the signal input is connected to the generator via a cable, the electrode and the counter electrode of the piezoelectric actuator can be short-circuited via the switching device 22 by connecting the potential line and the ground line.

The generator 20 moreover comprises a measuring device 30 in the form of an oscilloscope, which is connected to the potential connection 24 and the ground connection 24' by a parallel circuit. As shown in the circuit diagram, the measuring device 30 has an internal capacitance $C_{probe}$ and an internal resistance $R_{probe}$.

In order to perform the method according to the invention, the generator 20 shown in FIGS. 2, 3, and 4 is set into different states by using switching devices 21 and 22.

In FIG. 2, only the potential line is initially not interrupted so that the alternating voltage source is electrically conductively connected to the signal output, i.e., the switching device 21 is in a closed position. On the other hand, the switching device 22 is open so that there is a short-circuit current does not flow between the potential line and the ground line. The alternating voltage supplied by the voltage source 23 is thus applied to the potential connection 24. This alternating voltage is transmitted via the cable to the ultrasonic oscillatory unit so that it is applied via the signal input 11 to the piezoelectric actuator, i.e., between the electrode and the counter electrode of the piezoelectric actuator. The frequency of the applied alternating voltage is preferably selected to correspond a resonance frequency of the oscillatory system shown.

The piezoelectric actuator is set into oscillation by the applied alternating voltage. Accordingly, FIG. 2 shows the state of the circuit within an excitation interval [t₀,t₁] according to step (a) of the method according to the invention.

In order to proceed from step (a) to step (b) of the method according to the invention, the switching device 21 is actuated in such a way that the connection between the voltage source and the potential connection 24, i.e., the potential line 27, is interrupted so that the ultrasonic oscillatory system 10 performs a free, non-applied oscillation since alternating voltage is no longer applied between the electrode and the counter electrode of the piezoelectric actuator. The corresponding state of the circuit with a switching device 21 now opened is shown in FIG. 3 for alternative (b) (i) and in FIG. 4 for alternative (b) (ii).

Starting from an embodiment of the method according to the invention, in which alternative (i) is initially performed in step (b), and then step (d), consequently alternative (ii) from step (b), is performed, the generator remains in the state shown in FIG. 3 with open switching devices 21 and 22 for a first measurement interval [t₁,t₂] in which the voltage is measured with the measuring device 30 according to alternative (b) (i).

In order to measure the current or short-circuit current according to step (d) in a second measurement interval [t₂,t₃], the electrode and the counter electrode are short-circuited by actuating the switching device 22 to make a connection 28 between the potential line 27 and the ground line 26, as shown in FIG. 4. According to step (d), the short-circuit current is measured while the generator 20 according to the invention is in the state shown in FIG. 4, after which the switching device 21 is open and the switching device 22 is closed, and thus an electrically conductive, direct connection between the electrode and the counter electrode exists.

FIG. 5 shows in a two-dimensional diagram the time curve 1 of the voltage U and the time curve 2 of the DC current portion of the voltage U in the excitation interval [t₀,t₁], in the first measurement interval [t₁,t₂], and in the second measurement interval [t₂,t₃]. For the measurement shown here, an ultrasonic oscillatory system was excited in the time interval [t₀,t₁] with a frequency close to the resonance frequency of the ultrasonic oscillatory system by applying an alternating current (see state of the circuit of FIG. 2). At time t₁, the applied alternating current was switched off, whereupon a decay of the ultrasonic oscillatory system began (see state of the circuit of FIG. 3). In the course of this decay, an initially present DC voltage portion $U_{DC,1}$ of the voltage at time t₁ decreased exponentially until a DC voltage portion $U_{DC,2}$ at time t₂ was reached. The curve 1 of the voltage U results overall from this exponential decrease of the DC voltage portion $U_{DC}$ and the superimposed alternating voltage portion $U_{AC}$, the amplitude of which likewise decreases over the course of the measurement interval [t₁, t₂]. At time t₂, the electrode and the counter electrode are connected by the short-circuit line, i.e., are short-circuited, so that the voltage drops abruptly to zero at time t₂ and remains there for the duration of the second measurement interval [t₃,t₄], wherein the case t₂=t₃ is shown here (see state of the circuit of FIG. 4).

From the decrease of the DC voltage portion $U_{DC}$ over time, the characteristic time interval t can be determined according to step (c) (bb), for example by means of the formula:

$$t = (t2 - t1)/\ln\left(\frac{U_{DC,1}}{U_{DC,2}}\right)$$

FIG. 6 shows the time curve of the current I for the same measurement for which the curve of the voltage U is shown in FIG. 2. Thus, the time ta of FIG. 5 corresponds to the time t₂ of FIG. 2, at which the electrode and the counter electrode are short-circuited. In the measurement interval [t₃,t₄] shown in FIG. 6, a short-circuit current triggered by the short circuit is measured between the electrode and the counter electrode. The current has an alternating curve around the zero position, consequently a pure alternating current curve. The amplitude of the alternating current decreases exponentially. This can be seen by means of an imaginary envelope of the curve of the alternating current. From this exponential decrease, the resonant damping coefficient $D_{res}$ can be determined by a fit according to $e^{-D_{res}t}$. Accordingly, the antiresonant damping coefficient $D_{antires}$ can be determined from the decrease of an envelope of the alternating voltage portion $U_{AC}$ by means of the curve of the voltage shown in FIG. 5.

LIST OF REFERENCE SIGNS

1 Time curve of the voltage U
2 Time curve of the DC voltage portion $U_{DC}$
3 Time curve of the current I
10 Piezoelectric element/piezoelectric actuator
11 Signal input
15 Cable
20 Generator
21 First switching device
22 Second switching device
23 Alternating voltage source
24 Potential connection
24' Ground Connection
25 Ground
26 Ground line
27 Potential line
28 Short-circuit line
30 Measuring device/oscilloscope
40 Auxiliary line
100 Ultrasonic oscillatory system
$C_P$ Electric capacitance of the piezoelectric element
$R_m$ Equivalent resistance of ultrasonic oscillation system
$C_m$ Equivalent capacitance of the ultrasonic oscillatory system
$L_m$ Equivalent inductance of the ultrasonic oscillatory system
$C_{cable}$ Electric capacitance of the cable
$C_{probe}$ Internal capacitance of the measuring device (of the oscilloscope)
$R_{probe}$ Internal resistance of the measuring device (of the oscilloscope)
U Voltage
$U_{DC,1}$ DC voltage portion at time t₁
$U_{DC,2}$ DC voltage portion at time t₂
I Current
i Current (as vector quantity)
$i_m$ Mechanical current portion $i_{Cp}$ Electrical current portion
t Time
s Seconds
V Volts

The invention claimed is:

1. A method for determining an electric capacitance $C_{SW}$ of an electromechanical oscillatory system (100), which comprises a piezoelectric element (10) and at least one additional element coupled, with respect to oscillation, to the piezoelectric element (10), the piezoelectric element (10) having an electrode and a counter electrode, comprising the following steps:
  a) applying an electrical alternating voltage between the electrode and the counter electrode for the duration of an excitation interval in order to induce mechanical oscillation of the oscillatory system or of a sub-system of the oscillatory system so that after the excitation interval has expired, the oscillatory system or the sub-system performs a free oscillation without excitation,
  b) after the end of the excitation and during the free oscillation of the oscillatory system or of the sub-system without excitation: measuring a time curve of a voltage U (1) between the electrode and the counter electrode, and
  c) determining the electric capacitance $C_{SW}$ from the time curve of the voltage U (1), which time curve was measured in step b),
  wherein, in step b), a measuring device (30) having an internal capacitance $C_{probe}$ and an internal resistance $R_{probe}$ is used to measure the time curve of the voltage (1), and wherein step c) comprises the following sub-steps:
  aa) determining a time curve of a DC voltage portion $U_{DC}$ (2) from the time curve of the voltage U (1), which time curve was measured in step b),
  bb) determining a characteristic time interval T, within which an initial value of the DC voltage portion $U_{DC,O}$ measured in step b) has fallen to the value $U_{DC,O}/e$, wherein e is Euler's number,
  cc) calculating the electric capacitance $C_{SW}$ with the characteristic time interval T.

2. The method according to claim 1, wherein in step cc), the electric capacitance $C_{SW}$ is calculated using the formula $$C_{SW} = \left(\frac{\tau}{R_{probe}}\right) - C_{probe}.$$

3. The method according to claim 1, wherein in step a), excitation occurs at a frequency f close to or equal to a previously known resonance frequency of the oscillatory system (100).

4. The method according to claim 1, further comprising:
  d) short-circuiting the electrode and the counter electrode with a line (28) and measuring a time curve of a current I (3) through the line,
    wherein step b) occurs during a first measurement interval and step d) occurs during a second measurement interval,
  e) determining at least one further physical characteristic value from the time curve of the current I (3), which time curve was measured in step d).

5. The method according to claim 4, further comprising one or two of the following steps:
  f) determining a resonance frequency $f_{res}$ of the oscillatory system (100) from the time curve of the current I (3), which time curve was determined in step d),
  g) determining an anti-resonance frequency $f_{antires}$ of the oscillatory system (100) from the time curve of the voltage U (1), which time curve was determined in step b),
  h) step f), step g), and calculating the modal equivalent capacitance $C_m$ of the oscillatory system (100) from the capacitance $C_{SW}$ by means of the formula $$C_m = C_{SW}\left(\frac{f_{antires}^2}{f_{res}^2} - 1\right),$$

i) step h) and calculating the modal equivalent inductance $L_m$ of the oscillatory system (100) from the modal equivalent capacitance $C_m$, preferably by means of the formula $$L_m = \frac{1}{4\pi^2 f_{res}^2 C_m},$$

j) determining a resonant damping coefficient $D_{res}$, which characterises a decrease of an envelope of the time curve of the current I (3), which decrease is a function of the time t,
  k) determining an anti-resonant damping coefficient $D_{antires}$, which characterises a decrease of an envelope of the time curve of the voltage U (1), which decrease is a function of the time t,
  l) step f), step i), step j), and calculating the modal equivalent resistance $R_m$ by means of the formula $R_m = 4\pi D_{res} L_m f_{res}$.

6. The method according to claim 5, wherein a complete characterization of the oscillatory system (100) is carried out by performing steps f) to j) and all necessary preceding steps, within a time interval of less than 300 ms.

7. A method for determining an electric capacitance $C_{SW}$, of an ultrasonic oscillatory system (100) used for ultrasonic machining, the method being carried out during a machining break, the ultrasonic oscillatory system (100) comprising at least a generator (20), a converter comprising at least one piezoelectric element (10), and a sonotrode, the generator (20) supplying an alternating voltage that is converted by the piezoelectric element (10) of the converter into mechanical oscillation, the piezoelectric element (10) having an electrode and a counter electrode, wherein the sonotrode is brought into contact with a material to be machined in order to perform ultrasonic machining, and the sonotrode is not in contact with the material to be machined during the machining break, the method comprising the following steps:
  a) applying an electrical alternating voltage between the electrode and the counter electrode for the duration of an excitation interval in order to induce mechanical oscillation of the ultrasonic oscillatory system or of a sub-system of the ultrasonic oscillatory system so that after the excitation interval has expired, the ultrasonic oscillatory system or the sub-system performs a free oscillation without excitation,
  b) after the end of the excitation and during the free oscillation of the ultrasonic oscillatory system or of the sub-system without excitation:
  measuring a time curve of a voltage U (1) between the electrode and the counter electrode, and c) determining the electric capacitance $C_{sw}$ from the time curve of the voltage U (1), which time curve was measured in step b), wherein, in step b), a measuring device (30) having an internal capacitance $C_{probe}$ and an internal resistance $R_{probe}$ is used to measure the time curve of the voltage (1), and wherein step c) comprises the following sub-steps:

aa) determining a time curve of a DC voltage portion $U_{DC}$ (2) from the time curve of the voltage U (1), which time curve was measured in step b), bb) determining a characteristic time interval τ, within which an initial value of the DC voltage portion $U_{DC,O}$ measured in step b) has fallen to the value $U_{DC,O}/e$, wherein e is Euler's number, cc) calculating the electric capacitance $C_{sw}$ with the characteristic time interval I.

8. The method according to claim 7, wherein the following steps take place during the machining break:

A) determining the electric capacitance $C_{SW}$ of the ultrasonic oscillatory system (100), B) adjusting the alternating voltage as a function of the electric capacitance $C_{SW}$ of the ultrasonic oscillatory system (100), which electric capacitance was determined in step A).

9. The method according to claim 8, wherein step B) comprises the following sub-steps:

AA) determining the amplitude X of the mechanical oscillation of the ultrasonic oscillatory system (100) with the electric capacitance $C_{SW}$ of the ultrasonic oscillatory system (100), which electric capacitance was determined in step A), BB) comparing the amplitude X with a setpoint amplitude $X_0$, CC) setting the frequency and/or amplitude of the alternating voltage supplied by the generator (20) so that an amplitude X equal to the setpoint amplitude $X_0$ is reached.

\* \* \* \* \*

UNITED STATES PATENT AND TRADEMARK OFFICE
CERTIFICATE OF CORRECTION

| | |
|---|---|
| PATENT NO. | : 12,072,363 B2 |
| APPLICATION NO. | : 17/626615 |
| DATED | : August 27, 2024 |
| INVENTOR(S) | : Ertz et al. |

It is certified that error appears in the above-identified patent and that said Letters Patent is hereby corrected as shown below:

In the Specification

Column 12, Line 13, change "ta" to -- $t_3$ --

Signed and Sealed this
First Day of October, 2024

*Katherine Kelly Vidal*

Katherine Kelly Vidal
*Director of the United States Patent and Trademark Office*